United States Patent [19]
Ohishi et al.

[11] Patent Number: 6,145,543
[45] Date of Patent: Nov. 14, 2000

[54] AUTOMOTIVE HYDRAULIC MODULATOR

[75] Inventors: Yuuji Ohishi; Hideaki Takahashi; Yukinori Otsuka, all of Kanagawa, Japan

[73] Assignee: Unisia Jecs Corporation, Atsugi, Japan

[21] Appl. No.: 09/288,612

[22] Filed: Apr. 9, 1999

[30] Foreign Application Priority Data

Apr. 9, 1998 [JP] Japan ..................................... 10-97294
May 15, 1998 [JP] Japan ................................. 10-133278

[51] Int. Cl.[7] .................................................. F16K 11/20
[52] U.S. Cl. ........................................ 137/884; 303/119.3
[58] Field of Search ........................... 137/884; 251/368; 303/119.2, 119.3

[56] References Cited

U.S. PATENT DOCUMENTS

| 5,658,056 | 8/1997 | Rischen et al. | 303/119.2 |
| 5,836,355 | 11/1998 | Markulec et al. | 137/884 |
| 5,853,231 | 12/1998 | Iwamura et al. | 303/119.2 |
| 5,937,898 | 8/1999 | Gluf, Jr. et al. | 137/560 |

FOREIGN PATENT DOCUMENTS 8-80827  3/1996  Japan .
8-285117 11/1996 Japan .

*Primary Examiner*—John Fox
*Attorney, Agent, or Firm*—Foley & Lardner

[57] ABSTRACT

The invention relates to a hydraulic modulator having a hydraulic modulator block including a reservoir and a damper; and an electronic control block detachably attached to the surface of the hydraulic modulator block. The reservoir and the damper are overlapped with each other such that a surface of the hydraulic modulator block becomes entirely substantially flat. With this, the hydraulic modulator becomes simple in construction. The invention further relates to a hydraulic modulator having a solenoid valve; an electronic control circuit board; and an electric wiring pattern prepared by pressing a metal plate having a first major surface formed with a first tin layer and a nickel layer and a second major surface formed with a second tin layer, into a three-dimensional shape such that the electric wiring pattern is formed with (1) a first terminal having a surface that is formed with the first or second tin layer electrically connected with the solenoid valve, (2) a connector terminal having first and second surfaces respectively formed with the first and second tin layers, and (3) a second terminal having a surface that is formed with the nickel layer electrically connected with the electronic control circuit board. Thus, each terminal has a secure electrical connection with another member.

3 Claims, 10 Drawing Sheets

AUTOMOTIVE HYDRAULIC MODULATOR

BACKGROUND OF THE INVENTION

The present invention relates to an automotive hydraulic modulator used, for example, in the antilock-braking system (ABS) or traction control system.

Japanese Patent Laid-open Publication JP-A-8-80827 discloses an automotive hydraulic modulator used in ABS, which is formed with a pair of first accumulator chambers and a pair of second accumulator chambers.

Japanese Patent Laid-open Publication JP-A-8-285117 discloses a three-dimensionally configured electric wiring structure of a solenoid valve block.

SUMMARY OF THE INVENTION

It is an object of the present invention to provide a hydraulic modulator which is simple in construction and can simply be produced by using a small number of structural members.

It is another object of the present invention to provide a hydraulic modulator which can simply be produced by using a small number of structural members and has terminals each having a secure electrical connection with another member.

According to a first aspect of the present invention, there is provided a hydraulic modulator comprising: (a) a hydraulic modulator block comprising (1) a housing block having therein a hydraulic circuit, (2) a solenoid valve formed on a surface of the housing block, (3) a reservoir, and (4) damper; and (b) an electronic control block detachably attached to the surface of the hydraulic modulator block such that the hydraulic modulator block and the electronic control block are arranged in a direction. The electronic control block comprises (1) a solenoid valve cover for covering the solenoid valve, (2) an electric wiring pattern attached to the solenoid valve cover and electrically connected with the solenoid valve, and (3) a first circuit board having thereon a first electronic control circuit and electrically connected with the electric wiring pattern. The reservoir and the damper are arranged relative to each other and disposed below the solenoid valve such that the surface of the hydraulic modulator block becomes entirely substantially flat and thus that there is provided in the electronic control block a space directly below the solenoid valve. This space receives therein the first circuit board.

According to a second aspect of the present invention, there is provided a hydraulic modulator comprising (a) a solenoid valve; (b) an electronic control circuit board; and (c) an electric wiring pattern prepared by pressing a metal plate having a first major surface formed with a first tin layer and a nickel layer and a second major surface formed with a second tin layer, into a three-dimensional shape, such that said electric wiring pattern is formed with (1) a first terminal having a surface formed with said first or second tin layer electrically connected with said solenoid valve, (2) a connector terminal having first and second opposed surfaces respectively formed with said first and second tin layers, and (3) a second terminal having a surface formed with said nickel layer electrically connected with said electronic control circuit board.

DESCRIPTION OF THE PREFERRED EMBODIMENTS

With reference to FIGS. 1–6, a hydraulic modulator 1 according to the first preferred embodiment of the present invention will be described in detail in the following.

Figure 1:
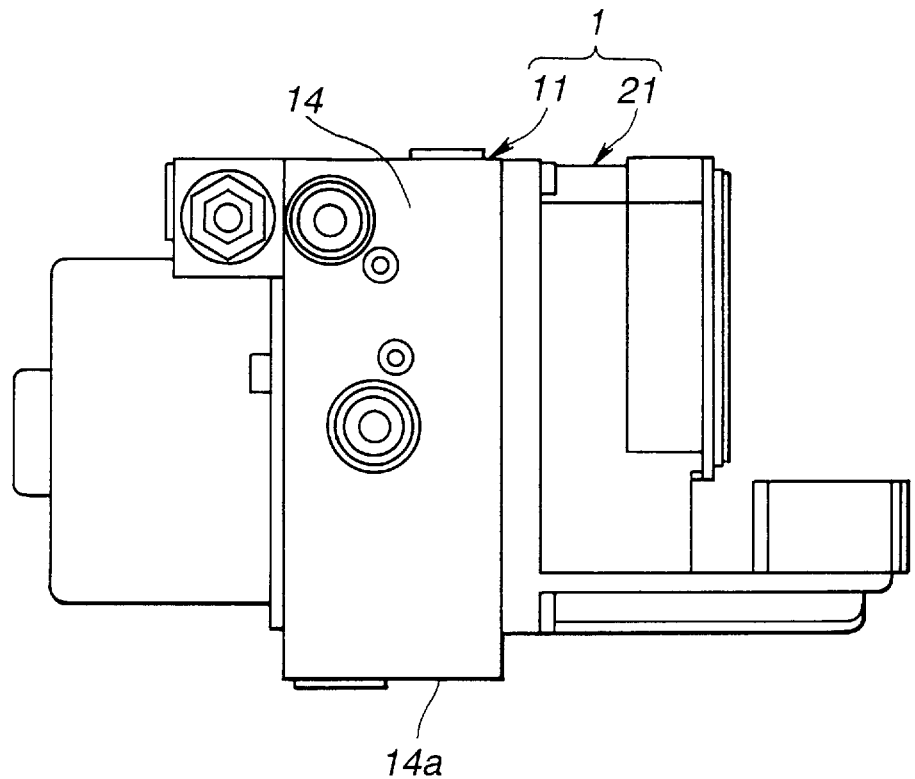
FIG. 1 is an elevational front view of a hydraulic modulator according to a first preferred embodiment of the present invention.

As is seen from FIG. 1, the hydraulic modulator 1 has a hydraulic modulator block (unit) 11 and an electronic control block (unit) 21 that is detachably attached to a side surface of the hydraulic modulator block 11. The hydraulic modulator block 11 has a housing block 14 having a bottom surface 14a.

Figure 2:
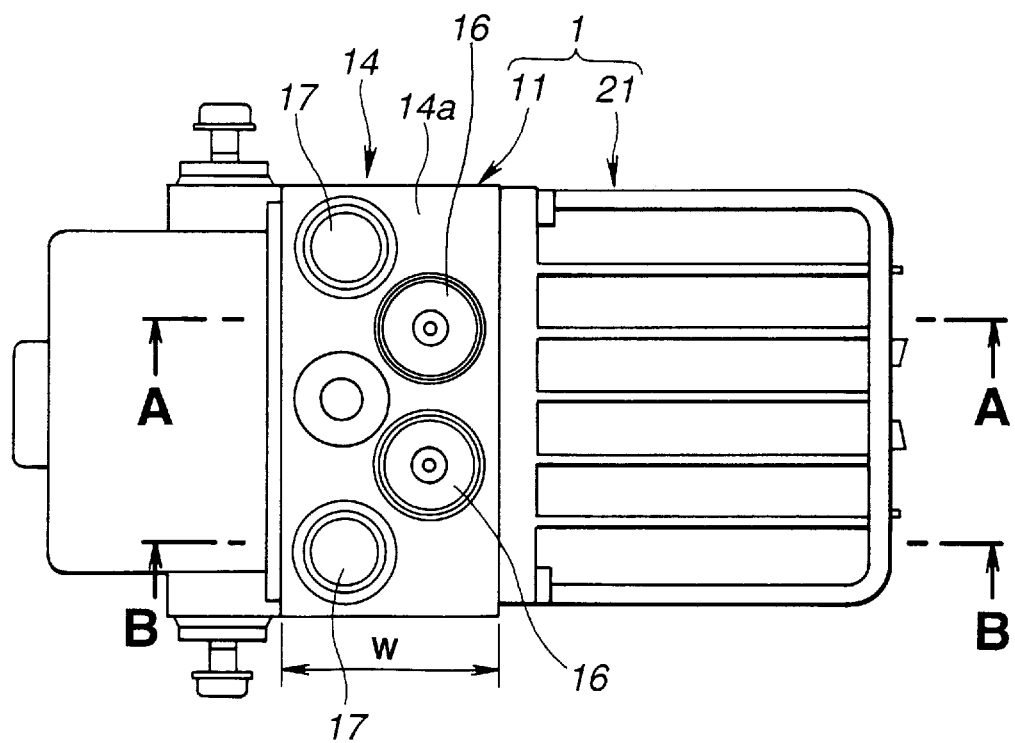
FIG. 2 is a bottom view of the hydraulic modulator.

As is seen from FIG. 2, the hydraulic modulator block 11 and the electronic control block 21 are arranged in a direction along lines A—A and lines B—B and the width W of the housing block 14. The hydraulic modulator block 11 has a pair of reservoirs 16 and a pair of dampers 17, formed on the bottom surface 14a of the housing block 14. The reservoir 16 and the damper 17 are overlapped with each other with respect to a direction (the vertical in FIG. 2) perpendicular to the direction of the width W of FIG. 2. With this, the width W of the housing block 14 becomes desirably short, depending on the degree of the overlap, and thus, as shown in FIGS. 3–6, it becomes possible to make a side surface 14b of the housing block 14 entirely substantially flat. In other words, the degree of the overlap therebetween is adjusted such that the side surface 14b becomes entirely substantially flat. With this, the hydraulic modulator becomes simple in construction and can simply be produced by using a small number of structural members, as explained hereinafter.

In contrast with the invention, if the above-mentioned overlap between the reservoir 16 and the damper 17 does not exist, the width W of the housing block 14 becomes substantially longer than that of FIG. 2. This means that the position of the reservoir 16 moves in FIG. 2 to the right relative to that of the damper 17. Thus, the housing block 14 is formed at its lower part with a projection for receiving therein part of the reservoirs 16. In this condition not according to the invention, part of the reservoirs 16 may be positioned directly below the solenoid valves 15. Thus, it becomes impossible or at least difficult to dispose a circuit board directly below the solenoid valves 15. Therefore, it may become necessary to separately conduct the step of electrically connecting an electric wiring pattern of the hydraulic modulator with the solenoid valves and the step of electrically connecting the electric wiring pattern with the circuit board. Furthermore, it may become necessary to provide a first lid member for covering the solenoid valves and a second lid member for covering the circuit board.

In contrast, according to the invention, the after-mentioned first circuit board 25 is positioned close to and directly below the solenoid valves 15. With this, it becomes easy to get an electric connection among the solenoid valves 15, the after-mentioned electric wiring pattern 23, and the first circuit board 25. Furthermore, it suffices to provide only a single lid member 28 for covering the solenoid valves, the electric wiring pattern 23, and the first and second circuit boards 25 and 29. This can reduce the cost for producing the hydraulic modulator.

Figure 3:
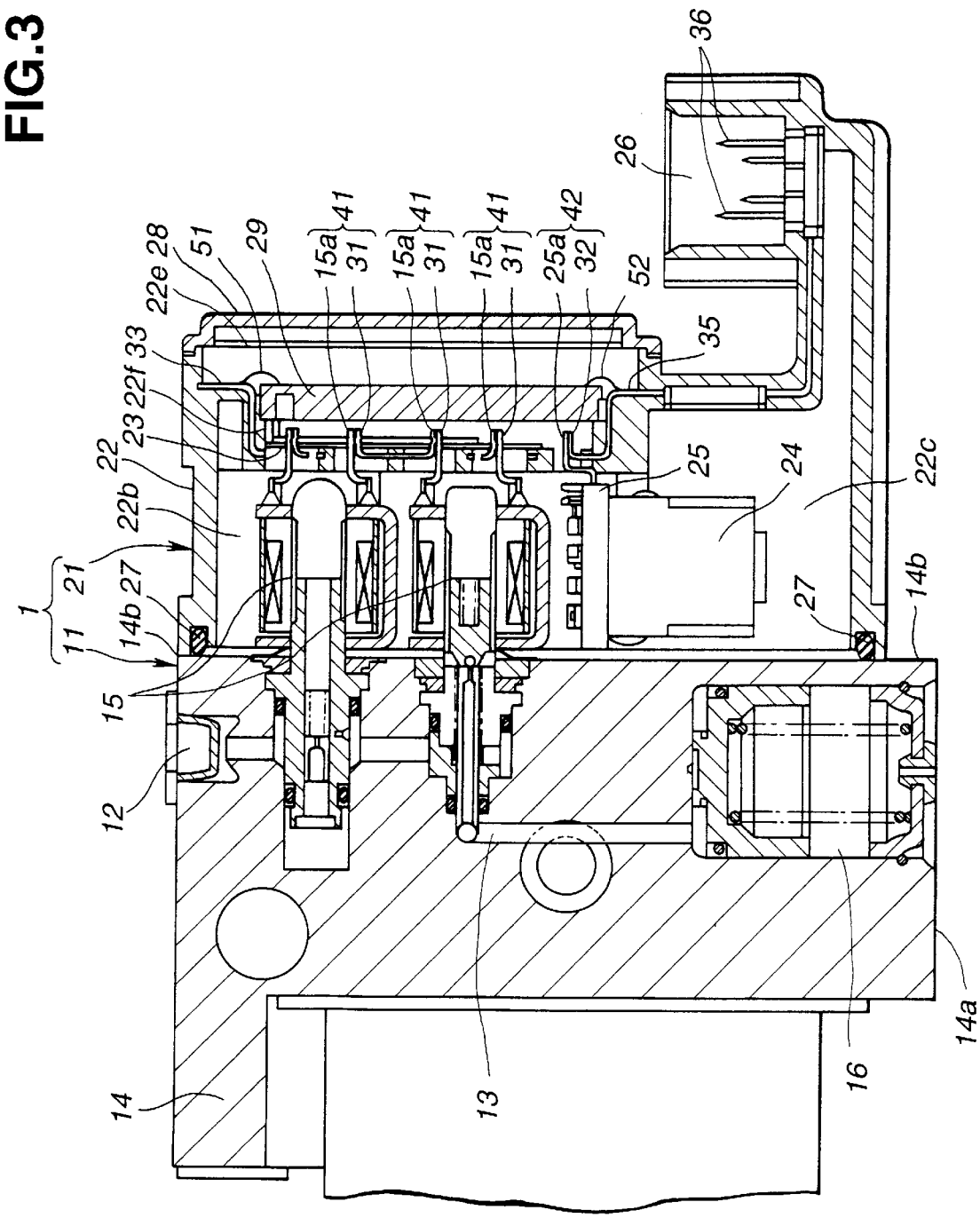
FIG. 3 is a sectional view taken along lines A—A of FIG. 2.
Figure 4:
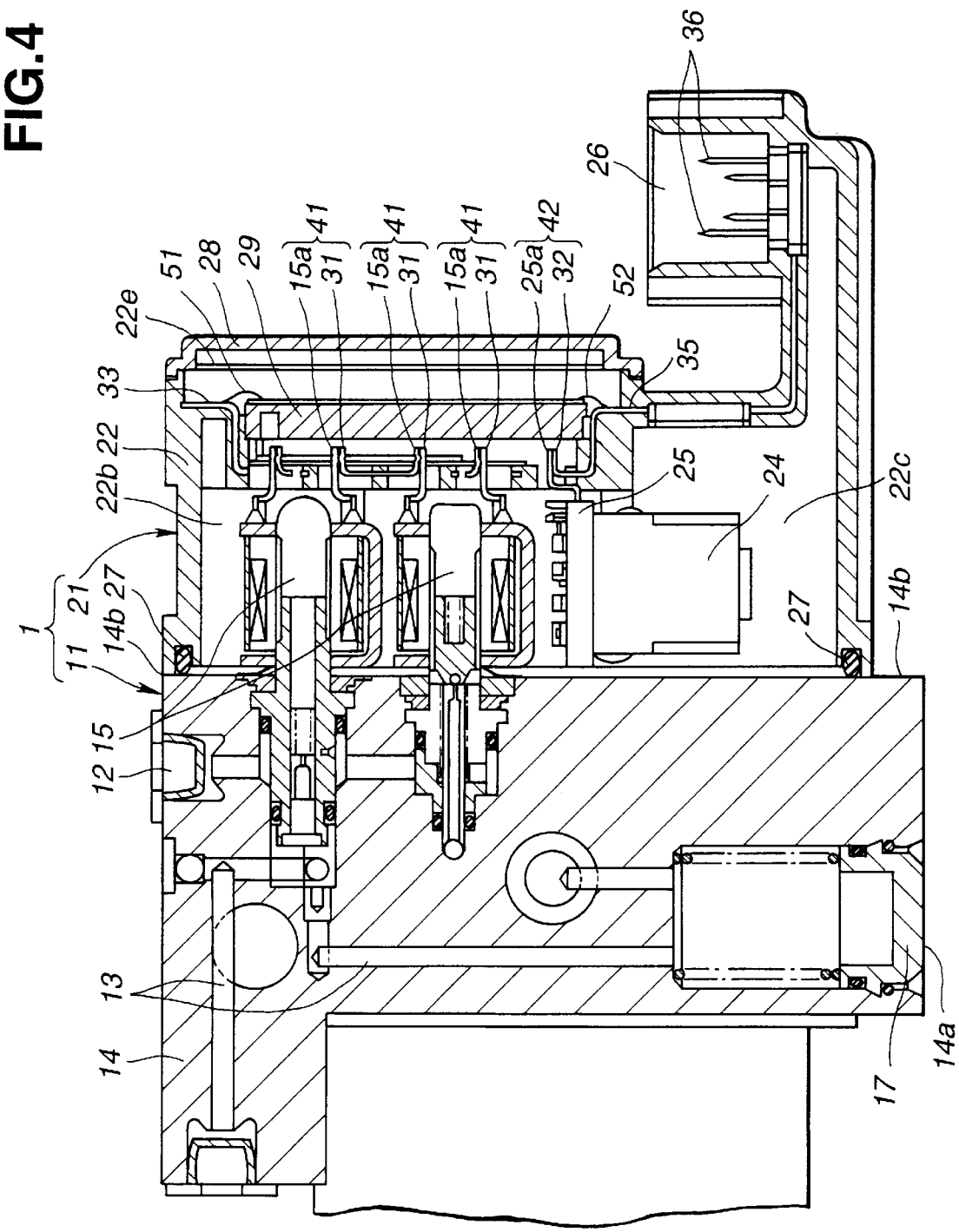
FIG. 4 is a sectional view taken along lines B—B of FIG. 2.

As is seen from FIG. 3, the housing block 14 is formed with a hydraulic circuit 13 and a hole 12 communicating with a braking pipe. A plurality of solenoid valves 15 are attached to the housing block 14 to be formed on the side surface 14*b*. The electronic control block 21 is detachably attached to the side surface 14*b* of the housing block 14. The electronic control block 21 has (1) a solenoid valve cover 22 for covering or receiving therein the solenoid valves 15, (2) the electric wiring pattern 23 attached to the inside surface of the solenoid valve cover ZZ and electrically connected with the solenoid valves 15, (3) the first circuit board (sub-plate) 25 having a first electronic control circuit mounted thereon, a relay 24 and the like, which are electrically connected with the electric wiring pattern 23, and (4) a connector 26.

Figure 5:
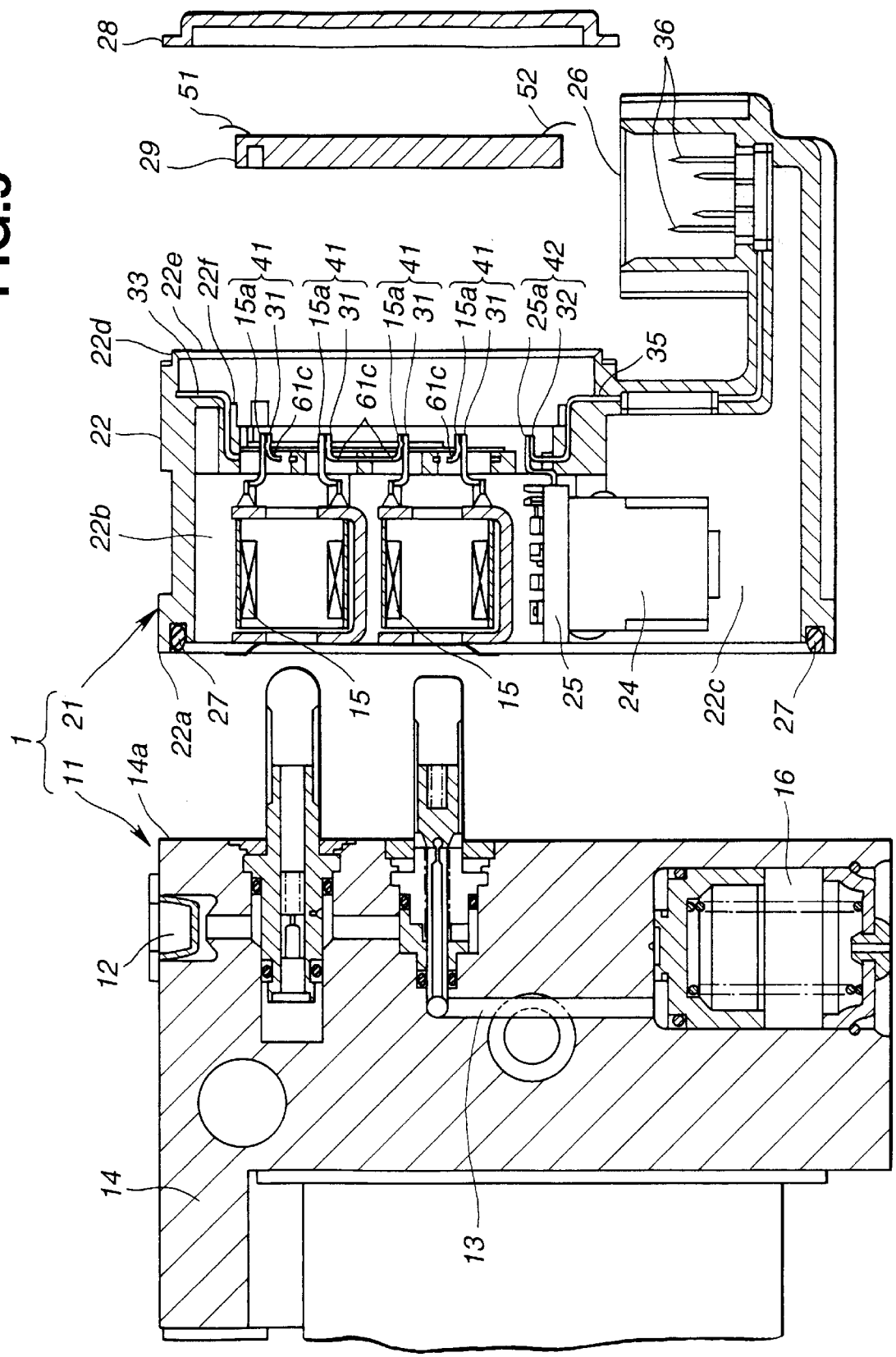
FIG. 5 is an exploded view of FIG. 3.

As is shown in FIG. 5, the solenoid valve cover 22 is prepared by molding to be generally L-shaped and has a surface 22*a* formed at its periphery with a sealing ring 27. The solenoid valve cover 22 is sealingly attached to the side surface 14*b* of the housing block 14 to obtain a sealing attachment. The solenoid valve cover 22 has (1) a first inner space 22*b* for receiving therein the solenoid valves 15 and (2) a second inner space 22*c*, which is positioned directly below the first inner space 22*b*, for receiving therein the first circuit board 25. The solenoid valve cover 22 further has an opening 22*e* and a supporting portion 22*f* positioned between the first inner space 22*b* and the opening 22*e*. A lid member 28 is detachably attached to the solenoid valve cover 22 in a manner to close the opening 22*e*. A second circuit board (ABS control board) 29 having thereon a second electronic control circuit is attached to the supporting portion 22*f* of the solenoid valve cover 22. The solenoid valve cover 22, which is made of plastic, is prepared by a molding process, using the electric wiring pattern 23 as an insert of the molding process, such that the solenoid valve cover 22 and the electric wiring pattern 23 are formed into a monolithic body by the molding process. The electric wiring pattern 23 is prepared by pressing a blank metal plate plated on its front and/or back surface with tin (Sn) and/or nickel (Ni), into a desired shape.

The electric wiring pattern 23 has (1) terminals 31 connected with coil terminals 15*a* of the solenoid valves 15, (2) terminals 33 and 35 each connected with the second circuit board 29, (3) a terminal 32 connected with the first circuit board Z5, and (4) connector terminals 36.

Figure 6:
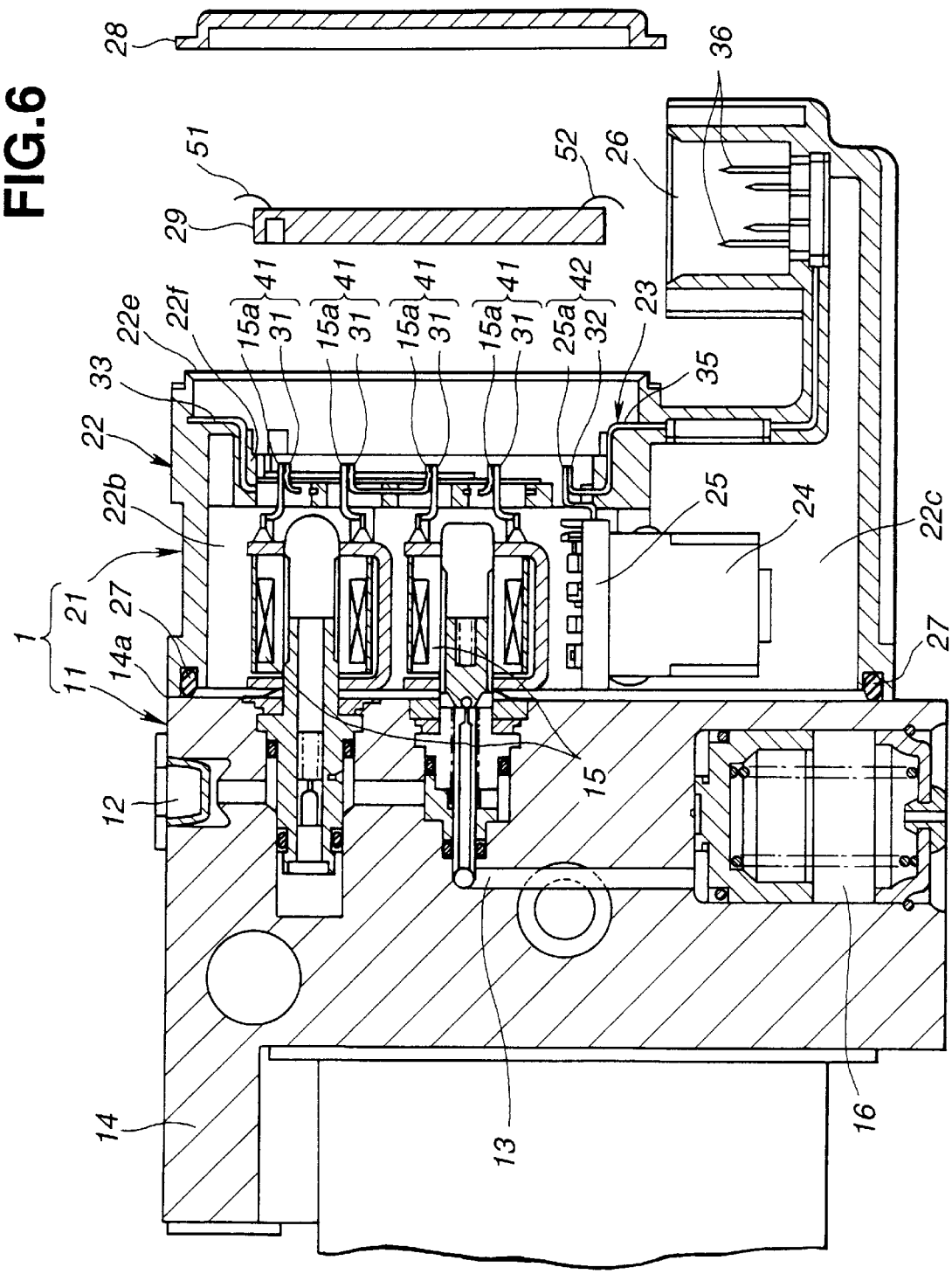
FIG. 6 is a view similar to FIG. 5, but showing an incomplete assemblage of structural members of the hydraulic modulator.

Assembly of the hydraulic modulator according to the first aspect of the invention will be described in the follow-ing. At first, the solenoid valve cover 22 is brought into attachment to the side surface 14*b* of the housing block 14. With this, as shown in FIG. 6, each terminal 31 becomes in contact with the adjacent coil terminal 15*a* to form a first connection 41 between the solenoid valve 15 and the electric wiring pattern 23. Furthermore, the terminal 32 becomes in contact with a terminal 25*a* of the first circuit board 25 to form a second connection 42 between the first circuit board 25 and the electronic wiring pattern 23. Then, the connections 41 and 42 are subjected to welding, fusing or the like through the opening 22*e* to assuredly get the electrical connection. Then, the second circuit board 29 is attached to the supporting portion 22*f* of the solenoid valve cover 22. Then, first and second leads 51 and 52 of the second circuit board 29 are respectively brought into electrical connection with the terminals 33 and 35, as shown in FIG. 3. This assembly is completed by attaching the lid member 28 to the solenoid valve cover 22 in a manner to close the opening 22*e*.

Figure 7:
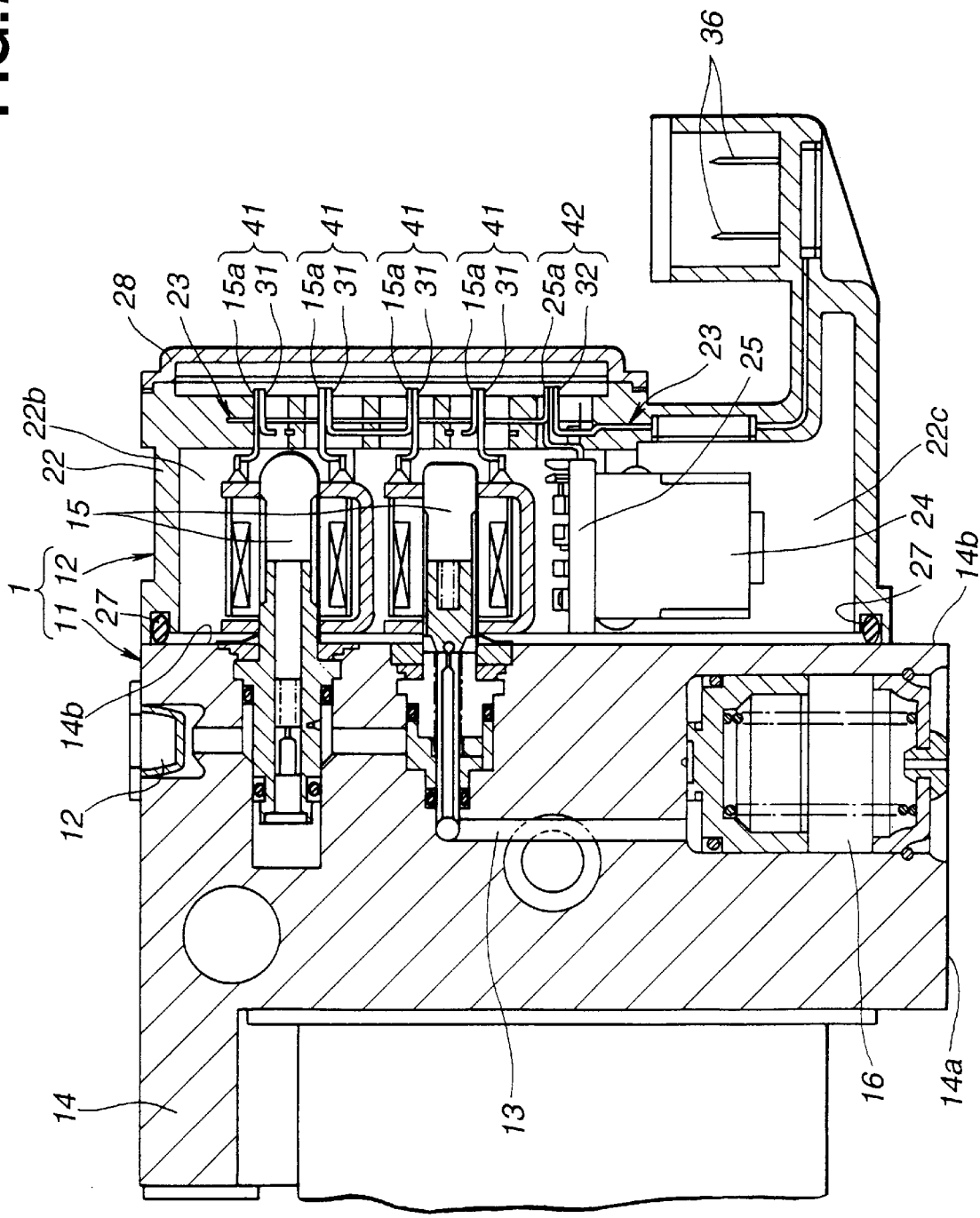
FIG. 7 is a view similar to FIG. 3, but showing a hydraulic modulator according to a second preferred embodiment of the present invention.
Figure 8:
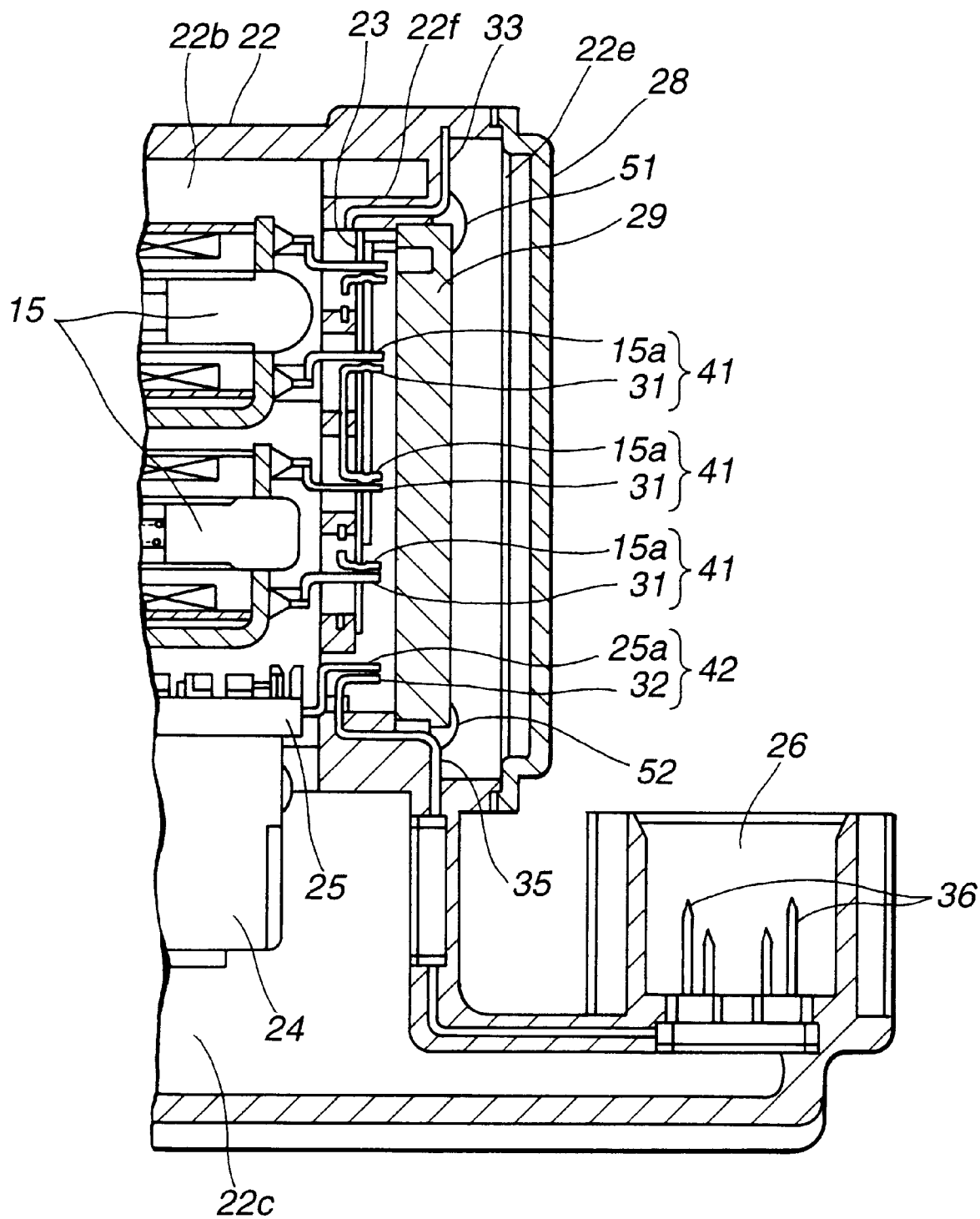
FIG. 8 is a partial enlarged view of FIG. 3.

With reference to FIG. 7, a hydraulic modulator according to a second preferred embodiment of the invention will be described in the following. This hydraulic modulator does not have the second circuit board 29 attached to the solenoid valve cover 22. Thus, the supporting portion 22*f* for supporting the second circuit board is omitted from the solenoid valve cover 22. Parts and constructions similar to those of the hydraulic modulator according to the first preferred embodiment will be denoted by the same numerals and a detailed description of them will be omitted.

Figure 9:
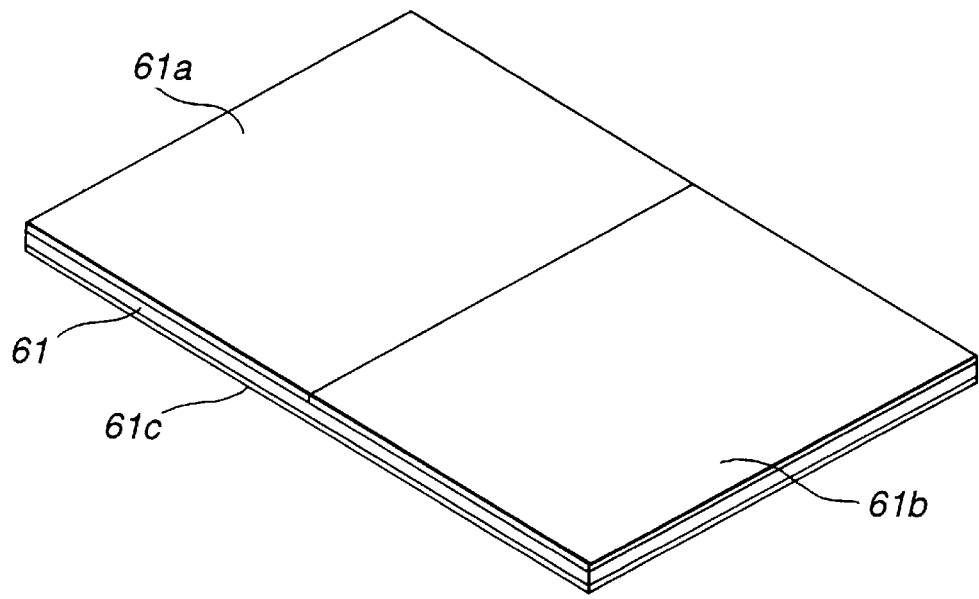
FIG. 9 is a perspective view of a metal plate for preparing an electric wiring pattern by pressing.

A hydraulic modulator according to the third preferred embodiment of the present invention will be described in detail in the following. Parts and constructions similar to those of the hydraulic modulator according to the first preferred embodiment of the present invention will be denoted by the same numerals. This hydraulic modulator has a special electric wiring pattern 23 according to the invention prepared by pressing a metal plate 61 into a three-dimensional shape shown in FIGS. 10–13. As is seen from FIG. 9, the metal plate 61 has a first major surface having a half plated with a tin layer 61*a* and another half plated with a nickel or gold layer 61*b*. Hereinafter, the nickel or gold layer 61*b* will be named "nickel layer" for simplification. The metal plate 61 has a second major surface fully plated with a tin layer 61*c*. The nickel layer is preferably used for "wire bonding". In other words, as shown in FIG. 3, it is preferable to form the nickel layer 61*b* for obtaining an electrical connection between the metal plate 61 and another member (e.g., the second electronic control circuit 29) through wire. Tin layer is too high in electric resistance to conduct wire bonding and preferably used for obtaining electrical connection through welding or fusing.

In contrast with the invention, if a tin layer is entirely formed on the metal plate 61, it becomes necessary to provide another metal plate having thereon a nickel layer for wire bonding. This may increase the number of structural members of the hydraulic modulator and the production cost, as compared with the invention. It is possible to solve these problems by the invention.

Figure 10:
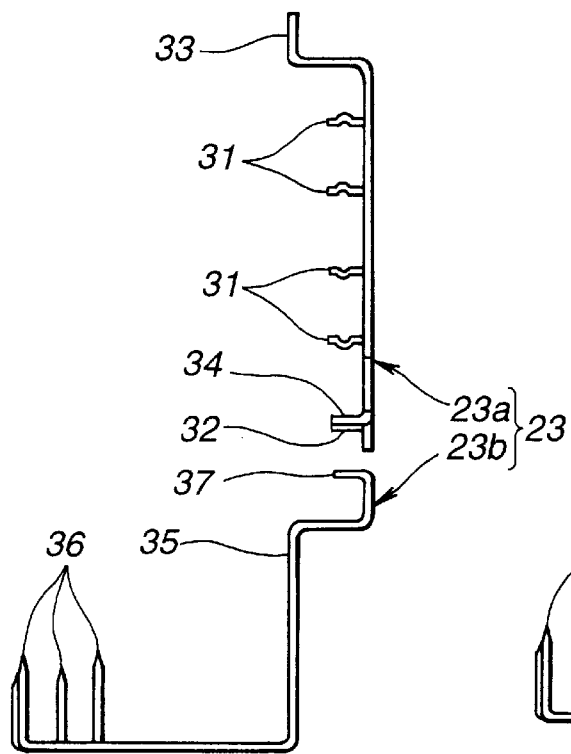
FIG. 10 is a side elevational view of first and second halves of the electric wiring pattern, prior to engagement thereof.
Figure 11:
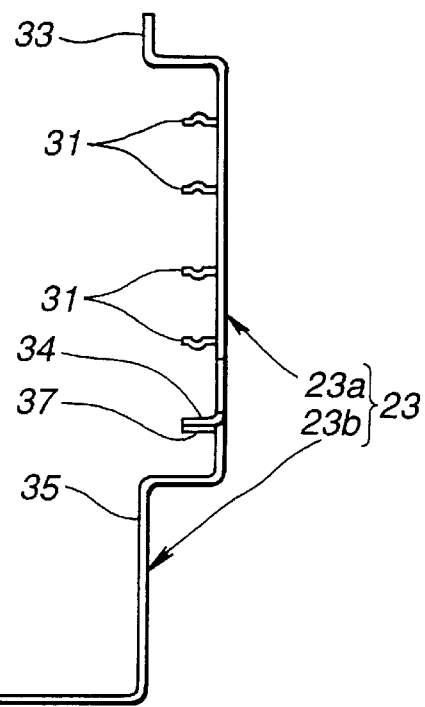
FIG. 11 is a view similar to FIG. 10, but showing a view after the engagement thereof.
Figure 12:
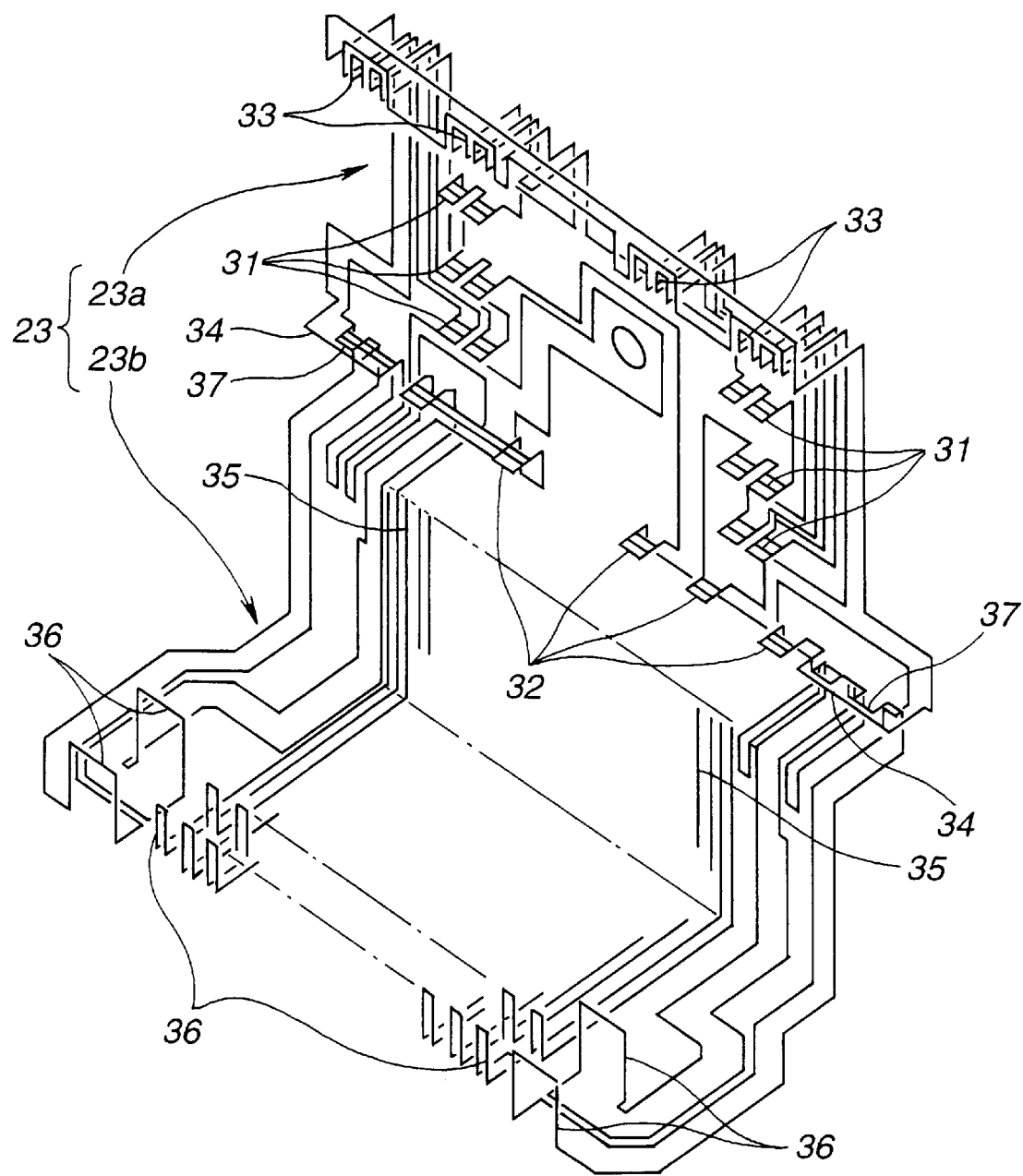
FIG. 12 is a perspective view of the electric wiring pattern.
Figure 13:
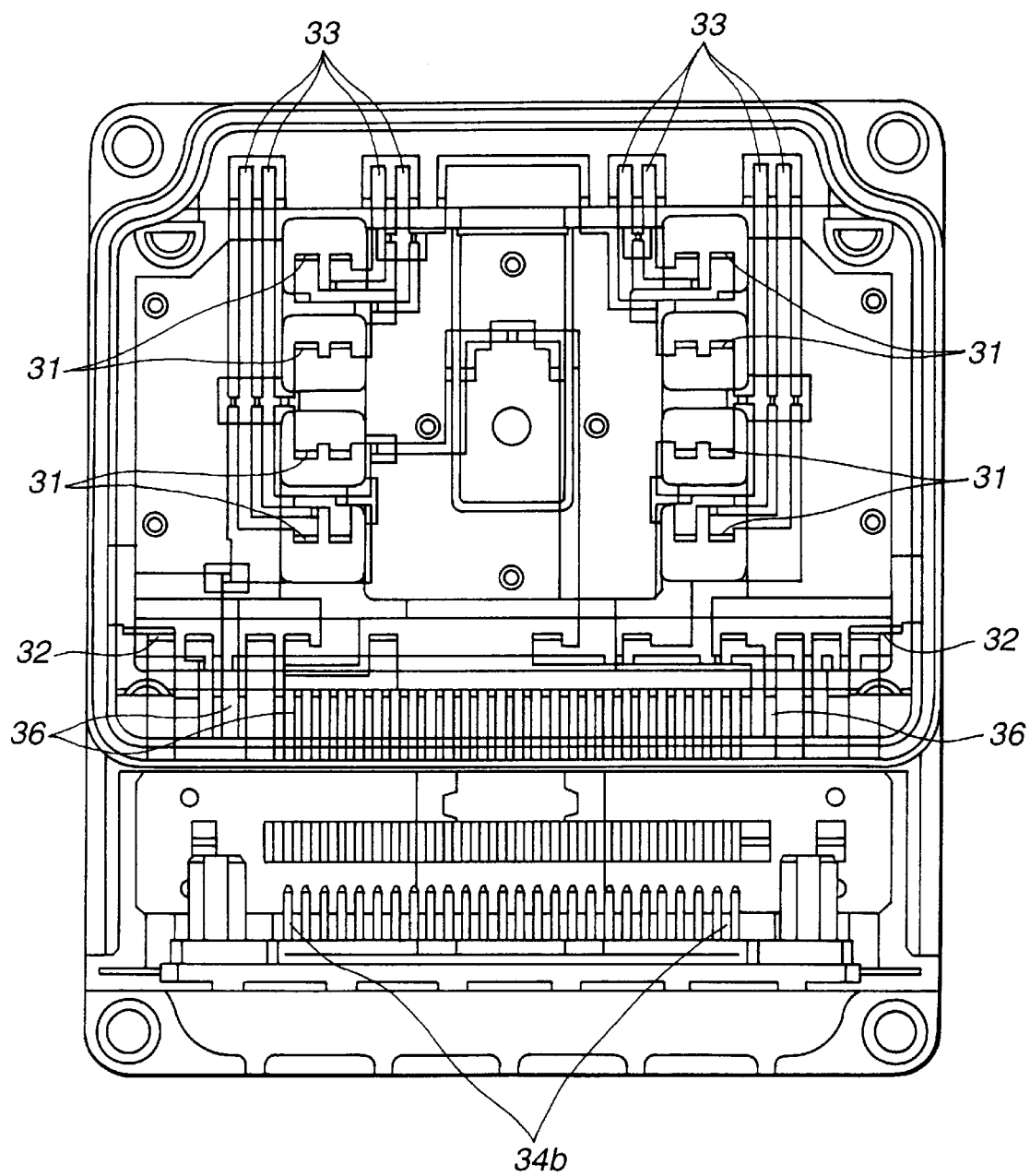
FIG. 13 is a front elevational view of the electric wiring pattern attached to a solenoid valve cover.

As shown in FIGS. 10 and 11, the electric wiring pattern 23 is prepared by engaging one metal plate (first half of the electric wiring pattern) 23*a* with another metal plate (second half thereof) 23*b*. The first half 23*a* has (1) terminals 31 to be connected with coil terminals 15*a* of the solenoid valves 15 through welding or fusing, (2) a terminal 32 to be connected with the terminal 25*a* of the first circuit board 25 through welding or fusing, (3) a terminal 33 to be connected with the upper end portion of the second circuit board 29 through wire bonding, and (4) a terminal 34 to be connected with the second half 23b of the electric wiring pattern 23 through welding or fusing. The second half 23b has (1) a terminal 35 to be connected with the lower end portion of the second circuit board 29 through wire bonding, (2) connector terminals 36, and (3) a terminal 37 to be connected with the first half 23a through welding or fusing. The first half 23a is prepared by pressing the metal plate 61 into a shape shown in FIG. 10 such that the tin layer 61c serves as the contact surface of each of the terminals 31 and 32, that the nickel layer 61b serves as the terminal 33, and that the tin layer 61a or 61c serves as the terminal 34. Herein, for example, the contact surface of the terminal 31 means a surface to connected with the coil terminal 15a of the solenoid valve 15. It is optional that the first half 23a is prepared by pressing another metal plate having a first major surface fully plated with a nickel or gold layer and a second major surface fully plated with a tin layer.

The second half 23b is prepared by pressing the metal plate 61 into a shape shown in FIG. 10 such that the tin layers 61a and 61c serve as the connector terminals 36, that the nickel layer 61b serves as the terminal 35, and that the tin layer 61a or 61c serves as the terminal 37.

As mentioned in the first preferred embodiment, the electric wiring pattern 23 is used as an insert of the molding process of the solenoid valve cover 22 such that the solenoid valve cover 22 and the electric wiring pattern 23 are formed into a monolithic body.

Assembly of the hydraulic modulator according to the third preferred embodiment of the invention will be described in the following. At first, the solenoid valve cover 22 is brought into attachment to the side surface 14b of the housing block 14. With this, as shown in FIG. 6, each terminal 31 (the tin layer 61c) becomes in contact with the adjacent coil terminal 15a to form a first connection 41 between the solenoid valve 15 and the electric wiring pattern 23. Furthermore, the terminal 32 (the tin layer 61c) becomes in contact with a terminal 25a of the first circuit board 25 to form a second connection 42 between the first circuit board 25 and the electronic wiring pattern 23. Then, the connections 41 and 42 are subjected to welding, fusing or the like through the opening 22e to assuredly get the electrical connection. Then, the second circuit board 29 is attached to the supporting portion 22f of the solenoid valve cover 22. Then, first and second leads 51 and 52 of the second circuit board 29 are respectively brought into electrical connection with the terminals 33 and 35 (the nickel layer), as shown in FIG. 3. This assembly is completed by attaching the lid member 28 to the solenoid valve cover 22 in a manner to close the opening 22e.

The entire contents of basic Japanese Patent Applications 10-97294 (filed Apr. 9, 1998) and 10-133278 (filed May 15, 1998) of the application, of which priority is claimed, are incorporated herein by reference.

What is claimed is:

1. A hydraulic modulator comprising:

a solenoid valve;

an electronic control circuit board; and an electric wiring pattern prepared by pressing a metal plate having a first major surface formed with a first tin layer and a nickel layer and a second major surface formed with a second tin layer, into a three-dimensional shape such that said electric wiring pattern is formed with (1) a first terminal having a surface that is formed with said first or second tin layer electrically connected with said solenoid valve, (2) a connector terminal having a first and second surfaces respectively formed with said first and second tin layers, and (3) a second terminal having a surface that is formed with said nickel layer electrically connected with said electronic control circuit board.

2. A hydraulic modulator according to claim 1, wherein said first or second tin layer of said first terminal is subjected to welding or fusing, thereby to obtain an electrical connection with said solenoid valve, and wherein said nickel layer of said second terminal is electrically connected with said electronic control circuit board through wire bonding using a lead therebetween.

3. A hydraulic modulator according to claim 1, wherein said electric wiring pattern comprises first and second halves each being prepared by pressing said metal plate into a three-dimensional shape such that said first half is formed with said first and second terminals and a third terminal having a surface formed with said first or second tin layer and that said second half is formed with said connector terminal and a fourth terminal having a surface that is formed with said nickel layer electrically connected with said electronic control circuit board.

* * * * *